(12) United States Patent
Sarin et al.

(10) Patent No.: US 8,274,835 B2
(45) Date of Patent: *Sep. 25, 2012

(54) MITIGATION OF RUNAWAY PROGRAMMING OF A MEMORY DEVICE

(75) Inventors: Vishal Sarin, Cupertino, CA (US);
Jonathan Pabustan, San Lorenzo, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 61 days.

This patent is subject to a terminal disclaimer.

(21) Appl. No.: 12/981,842

(22) Filed: Dec. 30, 2010

(65) Prior Publication Data
US 2011/0096608 A1    Apr. 28, 2011

Related U.S. Application Data

(63) Continuation of application No. 12/191,523, filed on Aug. 14, 2008, now Pat. No. 7,864,589.

(51) Int. Cl.
*G11C 16/04* (2006.01)

(52) U.S. Cl. ............................ 365/185.21; 365/185.22
(58) Field of Classification Search ............ 365/185.21, 365/185.22, 185.28
See application file for complete search history.

(56) References Cited

U.S. PATENT DOCUMENTS

| 6,831,864 B2 * | 12/2004 | Mizoguchi et al. ...... 365/185.29 |
| 7,194,571 B2 | 3/2007 | Yada et al. |
| 7,230,852 B2 * | 6/2007 | Mitani et al. ............. 365/185.18 |

* cited by examiner

*Primary Examiner* — Vu Le
(74) *Attorney, Agent, or Firm* — Leffert Jay & Polglaze, P.A.

(57) ABSTRACT

Methods for mitigating runaway programming in a memory device, methods for program verifying a memory device, a memory device, and a memory system are provided. In one such method, a ramp voltage signal is generated by a digital count signal. A memory cell being program verified is turned on by a particular verify voltage of the ramp voltage signal in response to a digital count of the digital count signal. The memory cell turning on generates a bit line indication that causes the digital count to be compared to a representation of the target data to be programmed in the memory cell. The comparator circuit generates an indication when the digital count is greater than or equal to the target data.

20 Claims, 9 Drawing Sheets

MITIGATION OF RUNAWAY PROGRAMMING OF A MEMORY DEVICE

RELATED APPLICATIONS

This application is a continuation of U.S. patent application Ser. No. 12/191,523 (allowed), filed Aug. 14, 2008 now U.S. Pat. No. 7,864,589 and titled "MITIGATION OF RUNAWAY PROGRAMMING OF A MEMORY DEVICE," which is commonly assigned and incorporated by reference in its entirety herein.

TECHNICAL FIELD

The present invention relates generally to memory devices and in a particular embodiment the present invention relates to non-volatile memory devices.

BACKGROUND

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

During a typical prior art programming operation of a flash memory cell, a selected word line coupled to the selected memory cell to be programmed is biased with a series of incrementing voltage programming pulses that start at an initial voltage that is greater than a predetermined programming voltage (e.g., approximately 16V). The programming pulse increases a charge level, thereby increasing the cell's threshold voltage $V_t$, on a floating gate of the memory cell.

Figure 1:
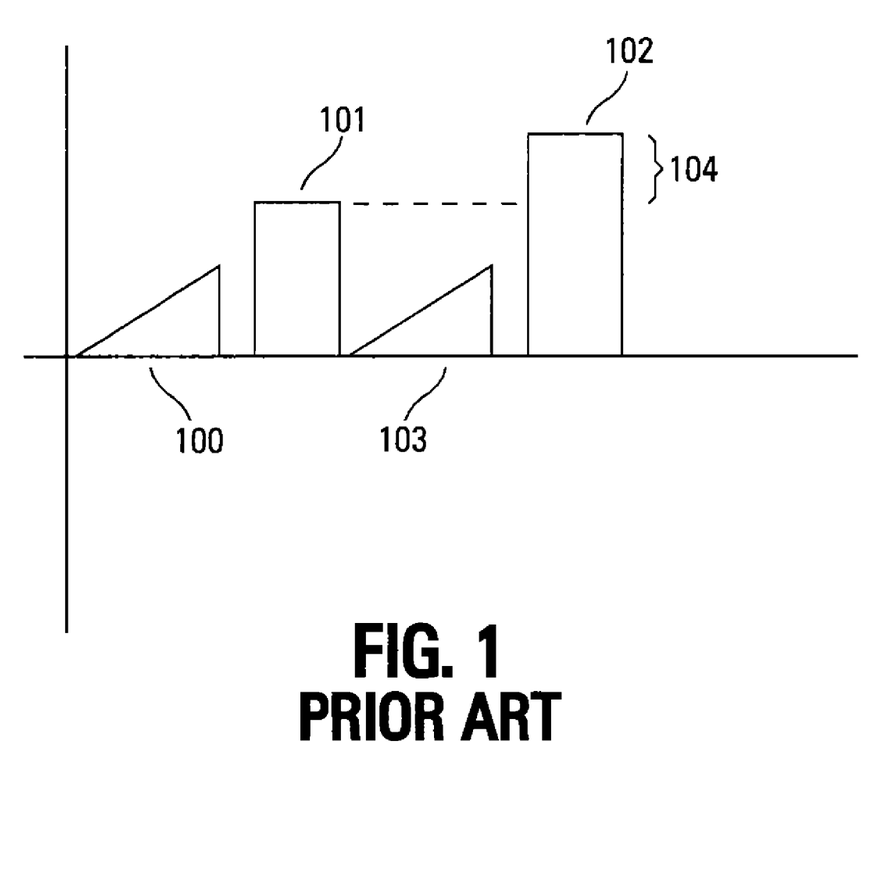
FIG. 1 shows typical program and program verify pulses.

A verify operation is performed after each programming pulse to determine if the cell's threshold voltage has increased to the target program level. FIG. 1 shows typical programming and program verify pulses. The programming pulses 101, 102 are incrementally increasing voltage pulses that start at a certain programming voltage (e.g., 16V) and increase by a step voltage 104 for every subsequent programming pulse. The programming pulses bias the selected word lines being programmed and are repeated until the memory cells being programmed pass a program verify operation. Each programming pulse increases the threshold voltage of the selected memory cells.

A verify pulse 100, 103 is typically a ramp voltage that biases the selected word lines between each programming pulse. The memory cells on the selected word line turn on when the ramp voltage reaches the threshold voltage to which the cells have been programmed. A current flows on the bit lines coupled to the memory cells being programmed when the memory cells turn on. This current flow is detected by sense amplifiers that indicate to comparison circuitry that a comparison operation should be performed to determine if the data stored in the memory cell is equal to the target data.

One problem with this method of program verification is that it does not take into account when the memory cell has been over-programmed. Over-programming results from a memory cell being under-programmed after one program pulse and the next program pulse causes the cell's threshold voltage to exceed the target threshold voltage.

Figure 8:
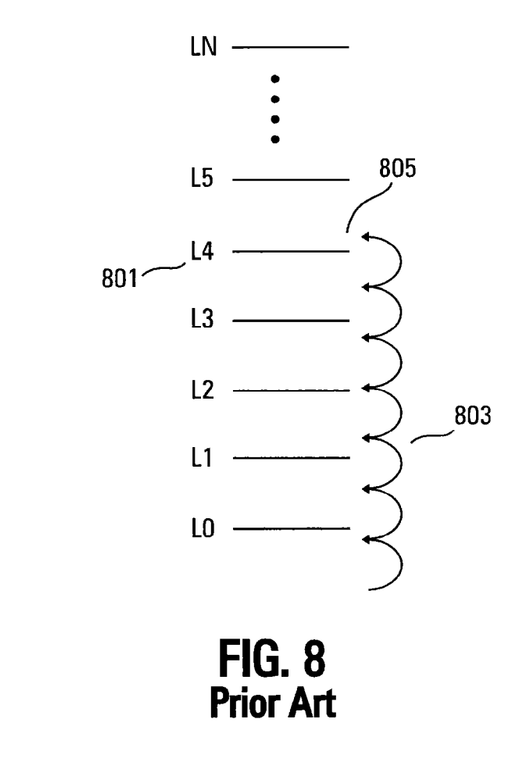
FIG. 8 shows typical prior art programming levels.

FIG. 8 illustrates a typical prior art programming operation with L0-LN programming levels. It is assumed that L4 is the target $V_t$ 801. As the memory cell is being programmed, its threshold voltage is incremented in programming steps 803 towards the target $V_t$ 801. When the threshold voltage is substantially close 805 to L4, the equal-to comparator inhibits further programming.

Figure 9:
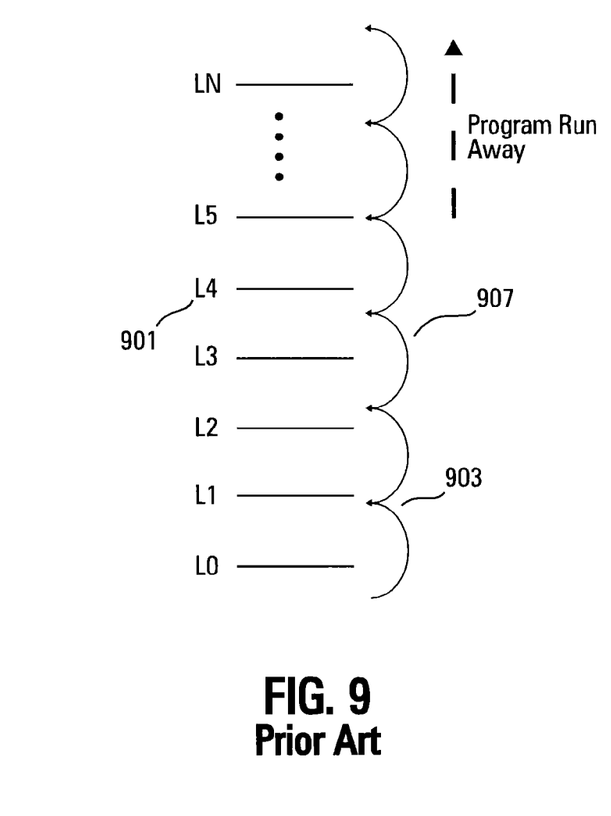
FIG. 9 shows typical prior art programming levels experiencing runaway programming.

Since the prior art program verification relies only on the target threshold voltage and the programmed threshold voltage being substantially equal to each other, once the cell's threshold voltage exceeds the target range, the two can no longer be equal and the selected memory cell continues to fail program verify operations. This results in additional programming pulses being issued to the memory cell thus resulting in runaway programming of that memory cell. The runaway programming is illustrated in FIG. 9.

Of the programming levels L0-LN, L4 is again assumed to be the target 901 programming level. The memory cell is programmed in larger threshold voltage programming steps 903. The threshold voltage step 907 prior to the L4 target does not quite reach the target threshold voltage 901. Thus, the next programming operation moves the threshold voltage past the L4 target. Another verify operation with an "equal-to" comparator at this point results in the threshold voltage being found not to be equal to the target threshold voltage. Programming of the memory cell continues, even though the threshold voltage is past the target 901 voltage, since the verify operation failed the "equal-to" comparison.

One method for reducing runaway programming is to use smaller incremental increases of the programming pulses from one programming pulse to the next. However, this results in degraded performance since the programming would require more time to reach the target threshold voltage.

For the reasons stated above, and for other reasons stated below that will become apparent to those skilled in the art upon reading and understanding the present specification, there is a need in the art to reduce runaway programming of memory cells.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
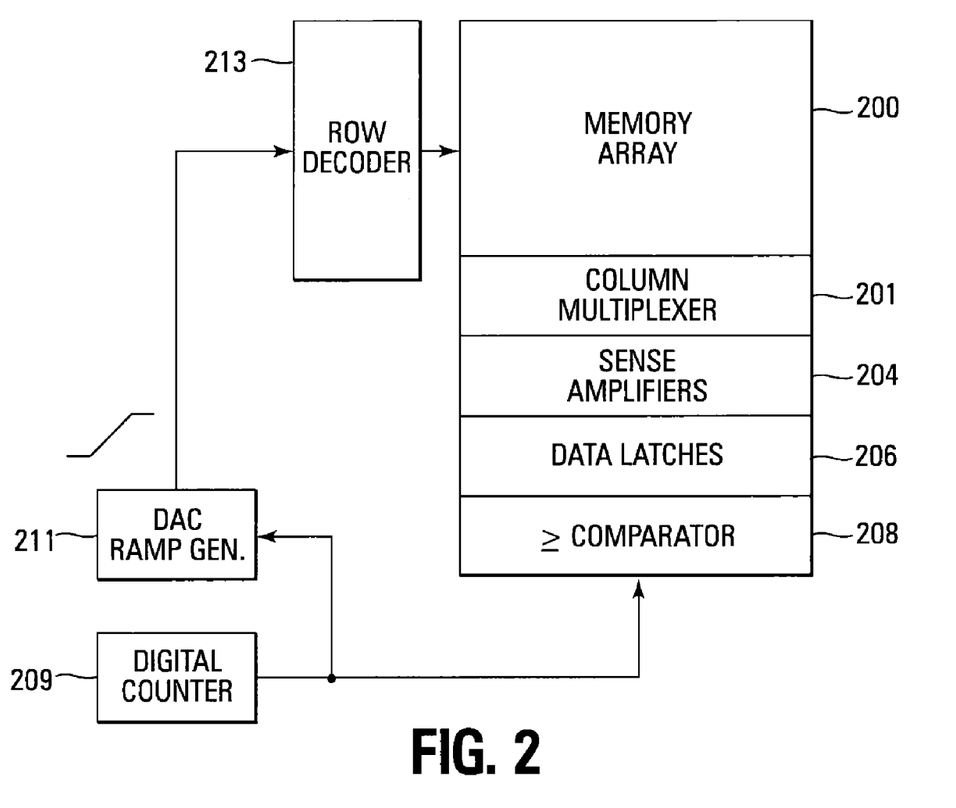
FIG. 2 shows a block diagram of a circuit for performing a program verify operation in accordance with one embodiment of the method for mitigation of runaway programming.
Figure 3:
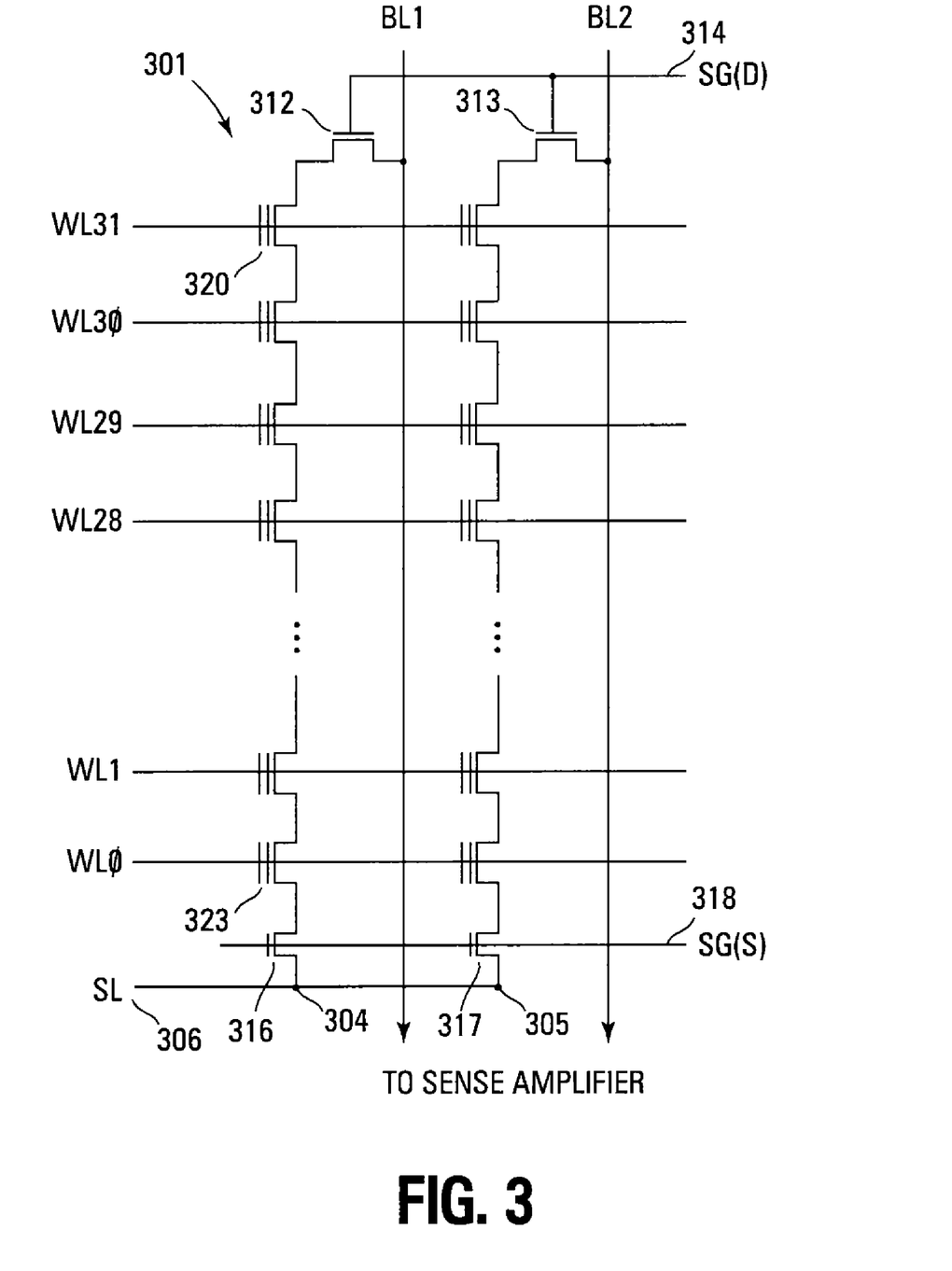
FIG. 3 shows schematic diagram of one embodiment of a portion of a memory array in accordance with the memory array of FIG. 2.

FIG. 2 illustrates one example of a circuit that performs a non-volatile memory program verify using the greater-than-or-equal-to comparison operation of the present embodiments. The memory array 200 comprises a plurality of non-volatile memory cells organized in rows and columns. Data lines (e.g., bit lines) are connected to the columns of memory cells that are also coupled to the column multiplexer 201. Access lines (e.g., word lines) are coupled to the control gates of the rows of memory cells (wherein the control gates themselves may make up the word line). One example of a non-volatile memory array is illustrated in FIG. 3 and discussed subsequently.

A digital counter 209 generates a digital count that is converted by a digital-to-analog converter (DAC) and ramp voltage generator 211 to an analog signal (ramp voltage). In one embodiment, the digital counter 209 is configured to count from 0 to 255.

The ramp voltage is input to the row decoder 213 during a program verify operation. The ramp voltage biases the selected word lines that are being programmed. When the ramp voltage reaches the threshold voltage to which the selected memory cell or cells are programmed, the selected memory cells programmed to that voltage turn on and current begins to flow in the bit lines coupled to the selected memory cells. The sense amplifiers 204, through the column multiplexer 201, sense the current and generate a signal indicating that the selected memory cells have turned on.

Figure 4:
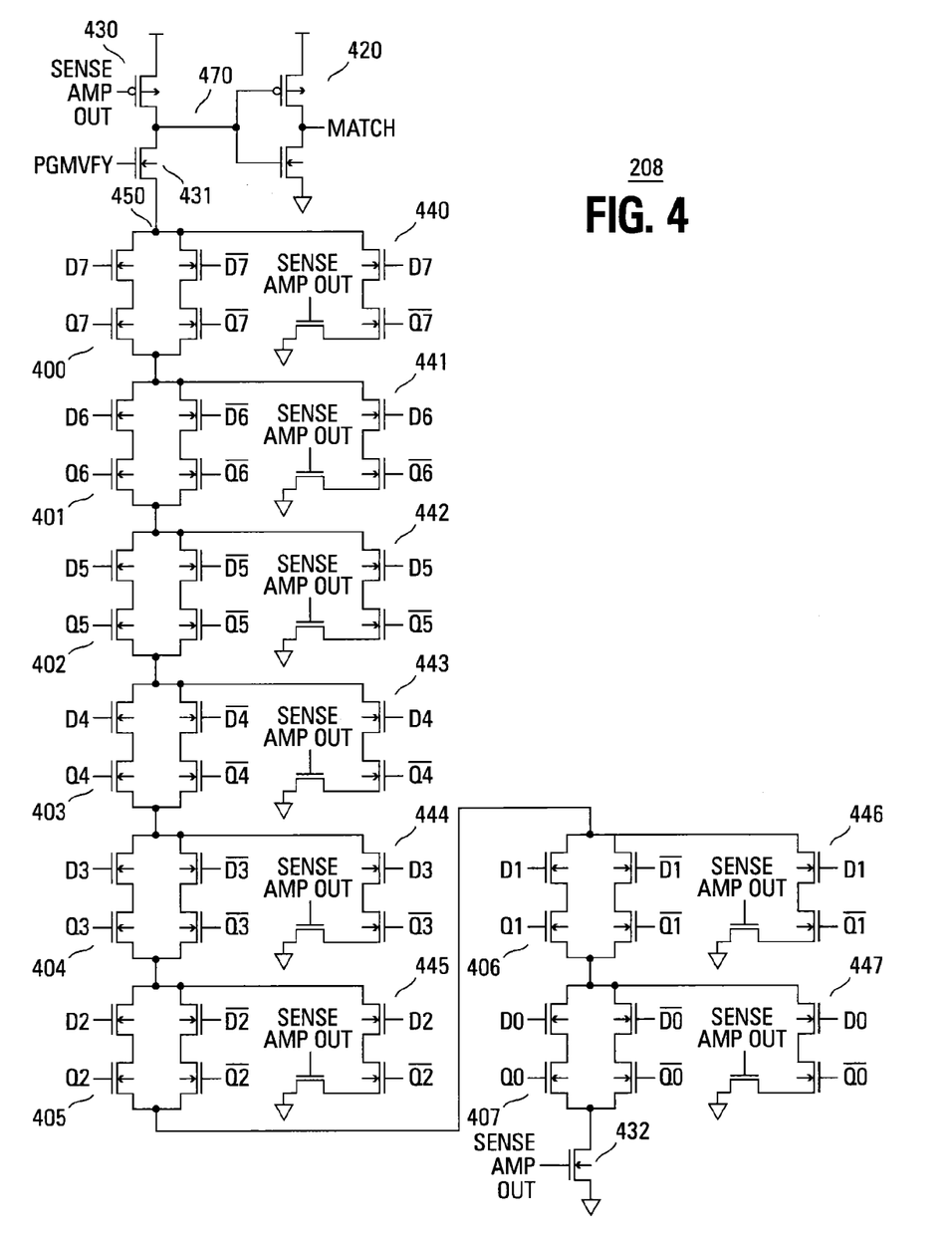
FIG. 4 shows a schematic diagram of one embodiment of a circuit for performing a greater-than-or-equal-to comparison in accordance with the method for mitigation of runaway programming.

When a program operation begins, the target data to which the memory cells are to be programmed are stored in the data latches 206. When the sense amplifier 204 indicates that the selected memory cells have turned on, a comparison is performed, by a greater-than-or-equal-to comparator 208, between the digital count that caused the memory cells to turn on and the target data that was stored in the data latches 206 at the beginning of the programming operation. FIG. 4, as described subsequently, illustrates one embodiment of a greater-than-or-equal-to comparator circuit of the present embodiment. When the greater-than-or-equal-to comparator 208 indicates that the programmed data is equal to or greater than the target data, a successful programming operation indication is generated that stops additional programming pulses.

Figure 7:
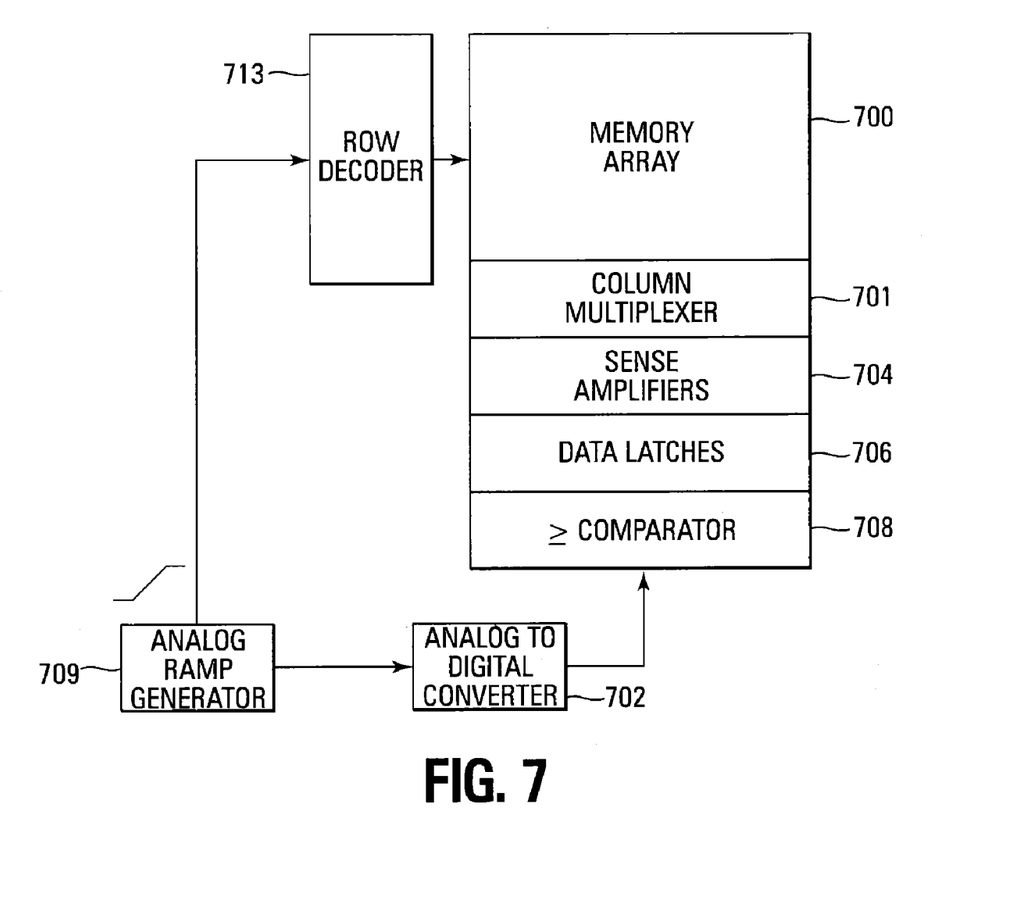
FIG. 7 shows a block diagram of a circuit of an alternate embodiment for performing a program verify operation in accordance with one embodiment of the method for mitigation of runaway programming.

FIG. 7 illustrates an alternate embodiment of a circuit for performing a non-volatile program verify using the greater-than-or-equal-to comparison operation. This embodiment uses the same memory array 700, column multiplexer 701, sense amplifier 704, data latches 706, and row decoder 713 of FIG. 2.

The embodiment of FIG. 7 uses an analog ramp generation circuit 709 that generates an analog ramp signal. The analog ramp signal is input to an analog-to-digital converter (ADC) 702. The output of the ADC 702 is a digital signal representative of the ramp signal. This digital signal is then used by the greater-than-or-equal-to comparator circuit 708 as described subsequently with reference to FIG. 4.

FIG. 3 illustrates a schematic diagram of a portion of a NAND architecture memory array 301 comprising series strings of non-volatile memory cells on which one embodiment of the method for charge loss compensation can operate. While the subsequent discussions refer to a NAND memory device, the present embodiments are not limited to such an architecture but can be used in other memory device architectures as well.

The array is comprised of an array of non-volatile memory cells 301 (e.g., floating gate) arranged in columns such as series strings 304, 305. Each of the cells 301 are coupled drain to source in each series string 304, 305. A word line WL0-WL31 that spans across multiple series strings 304, 305 is connected to the control gates of each memory cell in a row in order to bias the control gates of the memory cells in the row. The bit lines BL1, BL2 are eventually connected to sense amplifiers (not shown) that detect the state of each cell by sensing current on a particular bit line.

Each series string 304, 305 of memory cells is coupled to a source line 306 by a source select gate 316, 317 and to an individual bit line BL1, BL2 by a drain select gate 312, 313. The source select gates 316, 317 are controlled by a source select gate control line SG(S) 318 coupled to their control gates. The drain select gates 312, 313 are controlled by a drain select gate control line SG(D) 314.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ ranges that each indicate a different state. Some multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

FIG. 4 illustrates a schematic diagram of one embodiment of a comparator circuit 208 for performing a greater-than-or-equal-to comparison in accordance with the method for mitigation of runaway programming. This circuit is for purposes of illustration only as the greater-than-or-equal-to comparison discussed previously with reference to FIG. 2 can be performed using other circuits or in software that is executed by a control circuit.

The circuit 208 of FIG. 4 is comprised of a comparison circuit that includes eight equal-to circuits 400-407 and eight greater-than circuits 440-447. The circuit 208 additionally has two sense amplifier control signal transistors 430, 432, and a program verify control transistor 431. An inverter circuit 420 inverts an input from the comparison circuit and outputs that signal as the MATCH signal. In the illustrated embodiment, a MATCH signal of logical 1 indicates that the comparison of Dx (i.e., D7-D0) with Qx (i.e., Q7-Q0) has resulted in Dx being greater than or equal to Qx. A MATCH signal of logical 0 indicates that this is not true. An alternate embodiment can reverse this logic.

The greater-than-or-equal-to comparison performs a most-significant bit to least-significant bit comparison on a bit-by-bit basis. The comparison circuit portion of FIG. 4 is comprised of eight bit "equal-to" comparison circuits 400-407 that are each comprised of four transistors. The inputs D7-D0 are the count signal data from the digital counter circuit 209 of FIG. 2. The inputs $\overline{D7}$-$\overline{D0}$ are the inverse of the count signal data from the digital counter circuit 209. The inputs Q7-Q0 are the target data from the data latch 206 of FIG. 2. The inputs $\overline{Q7}$-$\overline{Q0}$ are the inverse of the target data from the data latch 206.

The "equal-to" comparison circuits 400-407 compare Dx to Qx to determine if these two signals are equal. If they are equal, at least one side of the comparison circuits 400-407 will be turned on.

Additional circuitry 440-447 is coupled to each "equal-to" bit comparison circuits 400-407. These circuits 440-447 are "greater-than" comparison circuits that performs a simple logical 1 to logical 0 comparison with Dx and $\overline{Qx}$. In other words, when Dx and Qx are equal, these circuits 440-447 are off. Also, when Qx is greater than Dx, these circuits 440-447 are off. However, when Dx is greater than Qx, at least one of these circuits 440-447 is on and pulling the input to the inverter circuit 420 to ground through a control transistor that is enabled by a logical high pulse on the SENSE AMP OUT signal. Thus, MATCH will be a logical 1.

The equal-to comparisons of the comparison circuit 208 of FIG. 4 propagate through from the top MSB circuit 400 to the bottom LSB circuit 407. At any point along the comparison, if the bits are equal the node 470 is discharged to ground and the comparison is stopped since further comparisons are not necessary.

As one example of operation, assume that Dx is "010000" and that Qx is "000100" so that Dx is greater than Qx. Prior to the program verify operation, SENSE AMP OUT is at a logical low state so that the top control transistor is turned on to precharge the input to the inverter circuit 420 to $V_{CC}$ (i.e., a logical 1 state). Thus, MATCH is at a logical 0 state. A logical high pulse on the SENSE AMP OUT signal indicates that current has been detected on the bit line of the memory cell being program verified. As discussed previously, this indicates that the Dx count has generated a threshold voltage of sufficient magnitude to turn on the memory cell causing it to conduct and produce the bit line current. Thus the top control transistor 430 is turned off when the SENSE AMP OUT signal goes high and the bottom control transistor 432 is turned on.

Starting at the MSB of each series of bits, both D7 and Q7 are 0. Therefore, the first "equal-to" circuit 400 will be turned on since $\overline{D7}$ and $\overline{Q7}$ are both logical ones and the transistors with those signal inputs will be on.

The next bits, D6=1 and Q6=0, are then compared. Since these bits are not equal, the D6/Q6 "equal-to" circuit 401 is not turned on. However, the D6/Q6 "greater-than" circuit 441 is turned on since D6 is greater than Q6. This is true because the D6 transistor is turned on by the logical 1 of D6 and the $\overline{Q6}$ transistor is turned on by the logical 1 of $\overline{Q6}$. This pulls the top node 450 of the comparison portion of the circuit to ground. If the PGMVFY is a logical 1, indicating that a program verify operation is being performed, the ground potential is applied to the input of the inverter circuit 420. Once inverted, the MATCH signal is now a logical 1 indicating that Dx is greater-than-or-equal-to Qx. The state of the remaining bits of the Dx and Qx series of bits is not relevant since the top node is already pulled to ground.

In another example of operation, assume that Dx is "100000" and Qx is "110100" so that Qx is greater than Dx. The D7 and Q7 bits of each series of bits are equal. Thus, the first "equal-to" comparison circuit 400 is turned on. The D6 and Q6 bits of each series of bits are not equal since D6=0 and Q6=1. Thus, the second "equal-to" comparison circuit 401 is not turned on. The "greater-than" D6/Q6 circuit 441 is also not turned on. Since D6=0, the top transistor of this circuit 441 is off and the top node 450 of the circuit is not pulled to ground. The MATCH output signal remains at a logical 0 since the input of the inverter circuit 420 is still precharged to $V_{CC}$.

As a final example of operation, if Dx and Qx are both equal it can be seen from the above examples that all of the "equal-to" comparison circuits 400-407 will be turned on. Since the lower control transistor 432 is turned on when the SENSE AMP OUT signal is high, this transistor 432 is on so that the top node 450 of the circuit is pulled to ground. Because a program verify operation is being performed, PGMVFY is high to turn on its respective transistor 431 so that the input of the inverter circuit 420 is at a logical 0 state. Thus, the MATCH output signal goes to a logical 1 state indicating that D7-D0 are equal to Q7-Q0.

Figure 5:
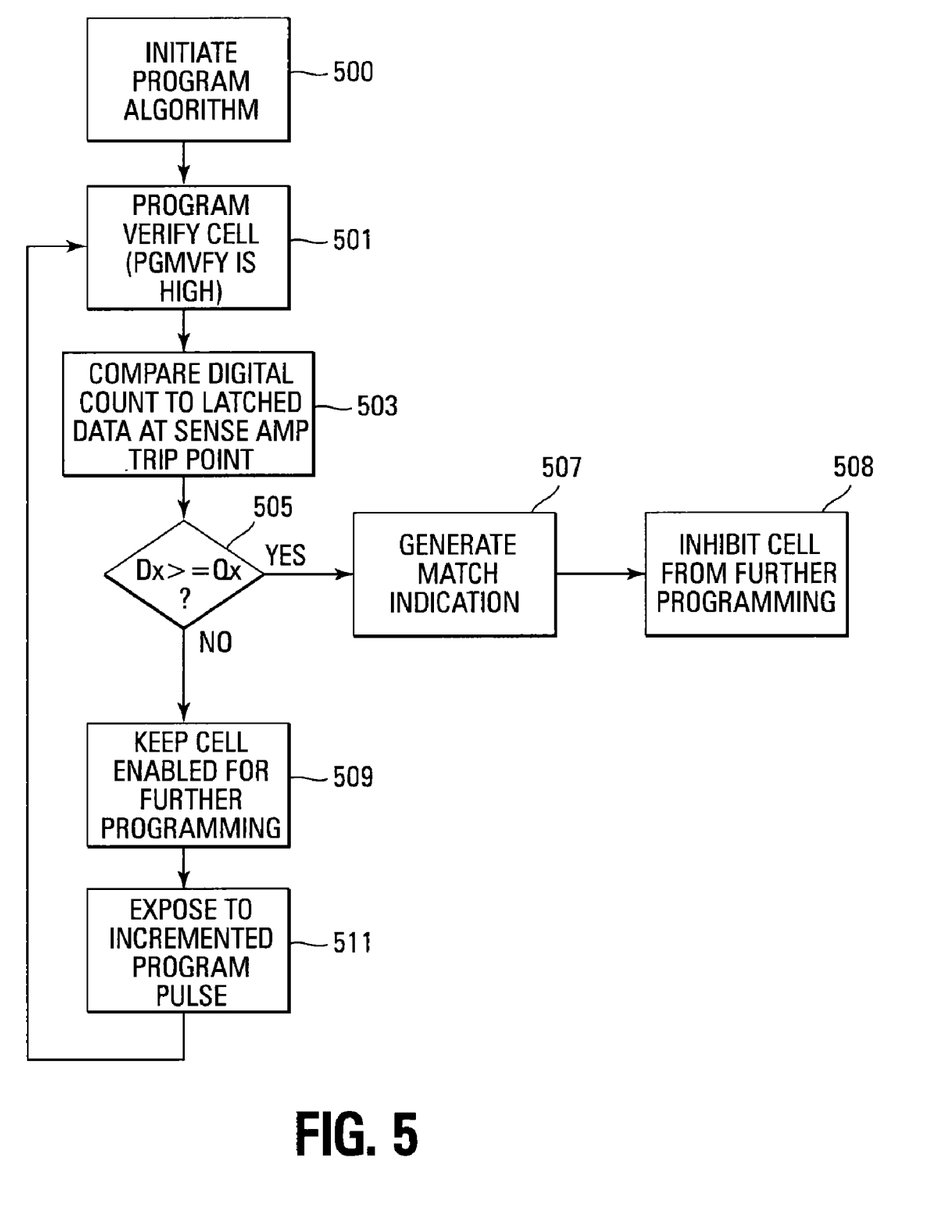
FIG. 5 shows a flowchart of one embodiment of a method for reducing runaway programming in a memory device in accordance with the embodiment of FIG. 4.

FIG. 5 illustrates a flowchart of one embodiment of a method for mitigating runaway programming in a memory device in accordance with the comparison circuit of FIG. 4. A programming algorithm is initiated 500. An initial indication of a program verify operation occurring is detected 501. This indication can be the PGMVFY signal going to a logical high, the SENSE AMP OUT signal going to a logical high, or a combination of the occurrence of these two signals.

When the selected memory cell turns on, the digital count signal responsible for generating the verify voltage that caused the memory cell to turn on is determined 502. Also at this point, the target data stored in the memory latches is also read.

The Dx and Qx bit strings are then compared from MSB to LSB 503. This can be accomplished by the comparison circuit of FIG. 4 or by some other means. If the comparison shows that Dx is greater-than-or-equal-to Qx 505, the MATCH signal is generated to indicate that this condition is true. If Dx is less than Qx, the MATCH signal indicates 509 that the Dx and Qx signals are not greater-than-or-equal-to each other. In this case, additional programming is necessary and another programmed pulse is generated 511 to further increase the threshold voltage of the selected memory cell or cells and the program verify process is repeated.

Figure 10:
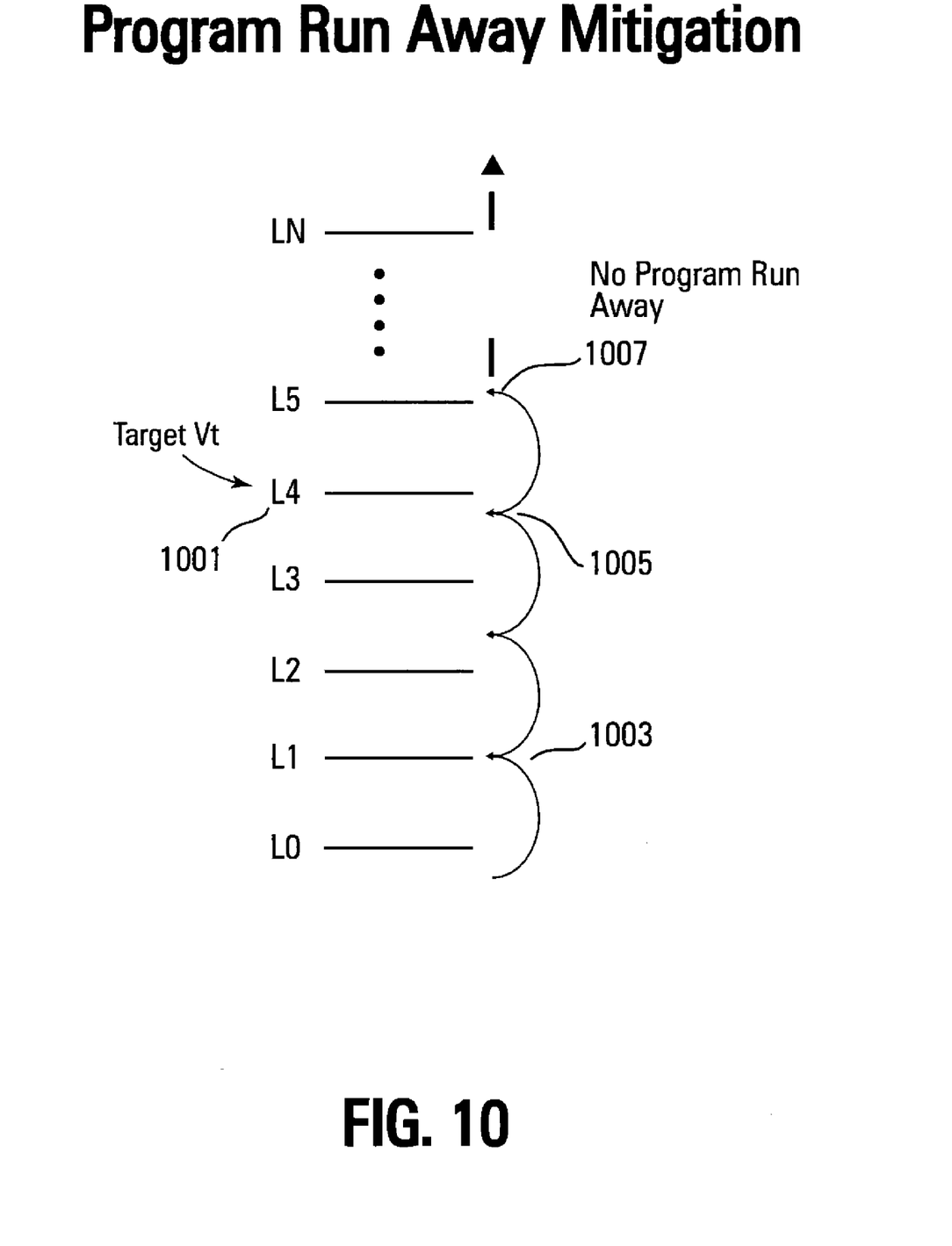
FIG. 10 shows programming levels in accordance with the method of FIG. 5.

FIG. 10 illustrates the results of the programming method of FIG. 5 as applied to programming levels L0-LN. In this example, it is assumed that L4 is the target $V_t$ 1001. As the programming pulses bias the selected memory cell, its threshold voltage is moved in steps 1003 from the erased level upward. At the point 1005 where the threshold voltage is close to the target level 1001, it will still fail the verify operation since the threshold voltage is less than the target threshold. The next programming pulse will cause the threshold voltage to increase to L5. However, the greater-than-or-equal-to comparator will inhibit further programming since the threshold voltage is now greater than the target threshold voltage 1001.

Figure 6:
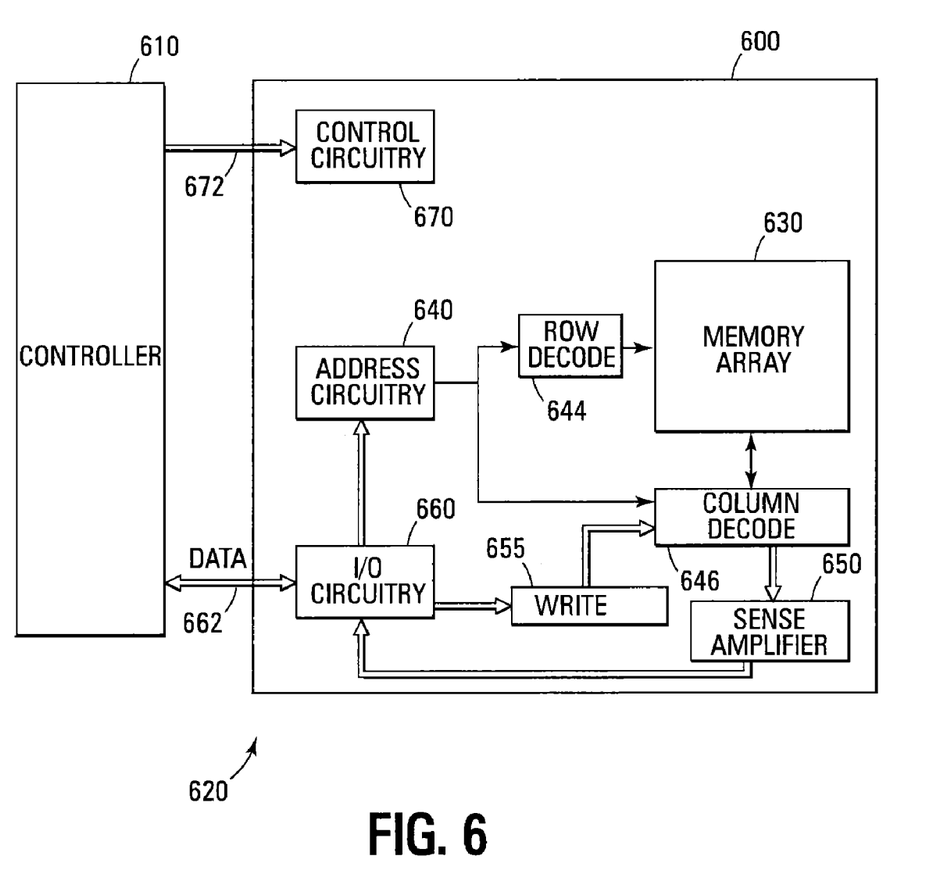
FIG. 6 shows block diagram of one embodiment of a memory system that incorporates the method for quick charge loss compensation.

FIG. 6 illustrates a functional block diagram of a memory device 600. The memory device 600 is coupled to an external controller 610. The controller 610 may be a microprocessor or some other type of control circuitry. The memory device 600 and the controller 610 form part of a memory system 620.

The memory device 600 has been simplified to focus on features of the memory that are helpful in understanding the present embodiments.

The memory device 600 includes an array 630 of non-volatile memory cells, such as the one illustrated previously in FIG. 3. The memory array 630 is arranged in banks of word line rows and bit line columns. In one embodiment, the columns of the memory array 630 are comprised of series strings of memory cells. As is well known in the art, the connections of the cells to the bit lines determines whether the array is a NAND architecture, an AND architecture, or a NOR architecture.

Address buffer circuitry 640 is provided to latch address signals provided through the I/O circuitry 660. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense amplifier circuitry 650. The sense amplifier circuitry 650, in one embodiment, is coupled to read and latch a row of data from the memory array 630. Data input and output buffer circuitry 660 is included for bidirectional data communication as well as address communication over a plurality of data connections 662 with the controller 610. Write circuitry 655 is provided to write data to the memory array.

Memory control circuitry 670 decodes signals provided on control connections 672 from the processor 610. These signals are used to control the operations on the memory array 630, including data read, data write (program), and erase operations. The memory control circuitry 670 may be a state machine, a sequencer, or some other type of controller to generate the memory control signals. In one embodiment, the memory control circuitry 670 is configured to execute the programming method of the present embodiments that mitigates runaway programming in the memory device.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments mitigate runaway programming of a memory device. The digital counter output signal, that is used to generate a program verify voltage, is compared to the target data stored in the data latch during programming. If the digital counter output signal is greater-than-or-equal-to the target data when the corresponding sense amplifier turns on, a match indication is generated. Otherwise, additional programming is performed. The program run away inhibit scheme enables use of advanced signal processing such as TCM & LDPC for data correction. This is because, even when correct program levels are not reached while programming, the program levels in error are close to the correct target levels.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory device, the method comprising:
   generating a verify voltage responsive to a count wherein the verify voltage is configured to activate a memory cell; and
   generating an indication signal when the count is greater than or equal to target data stored in the memory cell.

2. The method of claim 1 and further comprising storing the target data in data latches.

3. The method of claim 2 wherein generating the indication signal comprises comparing the target data stored in the data latches to the count that causes the memory cell to activate.

4. The method of claim 1 wherein the verify voltage is a ramped voltage signal.

5. The method of claim 4 wherein the ramped voltage signal is generated from a digital-to-analog converter converting the count into an analog signal.

6. The method of claim 1 wherein current in a data line coupled to the memory cell is detected to determine when the memory cell has been activated.

7. The method of claim 1 and further comprising:
   applying a programming pulse to the memory cell prior to the verify voltage; and
   halting additional programming pulses to the memory cell responsive to the indication signal.

8. A method for programming a memory device, the method comprising:
   storing, to a latch, target data to which a memory cell is to be programmed;
   applying a programming pulse to the memory cell; and
   performing a program verify operation on the memory cell after the programming pulse, the program verify operation comprising:
      biasing the memory cell with a ramped voltage signal;
      generating a digital representation of the ramped voltage signal;
      detecting when the memory cell is activated responsive to a particular voltage of the ramped voltage signal; and
      generating a program verify indication when the digital representation of the particular voltage is greater than or equal to the latch target data.

9. The method of claim 8 wherein an analog-to-digital converter is configured to convert the ramped voltage signal to the digital representation of the ramped voltage signal.

10. The method of claim 8 wherein applying the programming pulse comprises applying a series of programming pulses to the memory cell wherein each subsequent programming pulse is incrementally increased from a previous programming pulse wherein the program verify operation is performed after each programming pulse.

11. The method of claim 8 wherein biasing the memory cell with the ramped voltage signal comprises biasing a word line coupled to a control gate of a plurality of memory cells.

12. The method of claim 8 wherein both the digital representation of the ramped voltage signal comprises a plurality of digital data each representing a different voltage of the ramped voltage signal.

13. A memory device comprising:
   an array of memory cells;

a ramped voltage signal generator configured to generate a ramped voltage signal comprising a plurality of voltages, the ramped voltage signal generator coupled to control gates of memory cells of the array of memory cells;

an analog-to-digital converter coupled to the ramped voltage signal generator and configured to generate a digital representation of each of the plurality of voltages;

latches configured to store target data during a program verify operation of a memory cell, the target data indicative of data stored in the memory cell; and a greater-than-or-equal-to circuit coupled to the array of memory cells that is configured to generate a verify indication signal during the program verify operation when a digital representation of a voltage that activates the memory cell is greater than or equal to the target data.

14. The memory device of claim 13 wherein the array of memory cells comprises one of single level cells or multilevel cells.

15. The memory device of claim 13 wherein the greater-than-or-equal-to circuit comprises:

a plurality of equal-to comparison circuits configured to generate the verify indication signal only when the digital representation of the voltage that activates the memory cell is equal to the target data; and a plurality of greater-than comparison circuits coupled to the comparison circuit only when the digital representation of the voltage that activates the memory cell is greater than the target data.

16. The memory device of claim 15 wherein the plurality of equal-to comparison circuits and the plurality of greater-than comparison circuits are bit comparison circuits.

17. The memory device of claim 15 wherein the plurality of equal-to comparison circuits and the plurality of greater-than comparison circuits are configured to perform most-significant bit to least significant bit comparison on a bit-by-bit comparison.

18. The memory device of claim 13 and further comprising a sense amplifier that enables the greater-than-or-equal-to circuit in response to the activation of the memory cell.

19. The memory device of claim 15 wherein all of the plurality of equal-to comparison circuits are configured to be turned on when the digital representation of the voltage that activates the memory cell is equal to the target data.

20. The memory device of claim 19 wherein the plurality of greater-than circuits are configured to be turned off when the digital representation of the voltage that activates the memory cell is equal to the target data.

* * * * *